(12) United States Patent
Wang et al.

(10) Patent No.: US 9,029,696 B2
(45) Date of Patent: *May 12, 2015

(54) ELECTRONIC DEVICE

(71) Applicants: Inventec (Pudong) Technology Corporation, Shanghai (CN); Inventec Corporation, Taipei (TW)

(72) Inventors: Feng-Ku Wang, Taipei (TW); Yi-Lun Cheng, Taipei (TW); Chih-Kai Yang, Taipei (TW)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 198 days.

This patent is subject to a terminal disclaimer.

(21) Appl. No.: 13/794,922

(22) Filed: Mar. 12, 2013

(65) Prior Publication Data
US 2014/0083655 A1 Mar. 27, 2014

(30) Foreign Application Priority Data
Sep. 27, 2012 (CN) .......................... 2012 1 0369320

(51) Int. Cl.
F28F 7/00 (2006.01)
H01L 23/427 (2006.01)
H01L 23/467 (2006.01)
G06F 1/20 (2006.01)
F28D 15/02 (2006.01)

(52) U.S. Cl.
CPC ............... *F28F 7/00* (2013.01); *F28D 15/0233* (2013.01); *F28D 15/0275* (2013.01); *H01L 23/427* (2013.01); *H01L 23/467* (2013.01); *G06F 1/203* (2013.01)

(58) Field of Classification Search
USPC .............................. 361/692, 700; 174/50, 121
See application file for complete search history.

(56) References Cited

U.S. PATENT DOCUMENTS 7,189,918 B2 * 3/2007 Sakata ....................... 174/17 VA
2007/0187126 A1 * 8/2007 Liang .............................. 174/50

* cited by examiner

*Primary Examiner* — Andargie M Aychillhum
(74) *Attorney, Agent, or Firm* — Huffman Law Group, PC

(57) ABSTRACT

An electronic device includes a case, a heat source, a radiator, and an air stream generator. The case has an air ventilation hole and an opening. The radiator is disposed in the case and in thermal contact with the heat source. The radiator includes a main body having a first, a second, and a third side surface. A first air inlet, an air outlet, and a second air inlet are disposed on the first side surface, the second side surface, and the third side surface, respectively. The third side surface and the case are separated by a distance from each other. The second air inlet is disposed between a geometric middle plane of fins of the main body and the second side surface. The distance between the second air inlet and the first side surface is greater than that between the air ventilation hole and the first side surface.

22 Claims, 12 Drawing Sheets

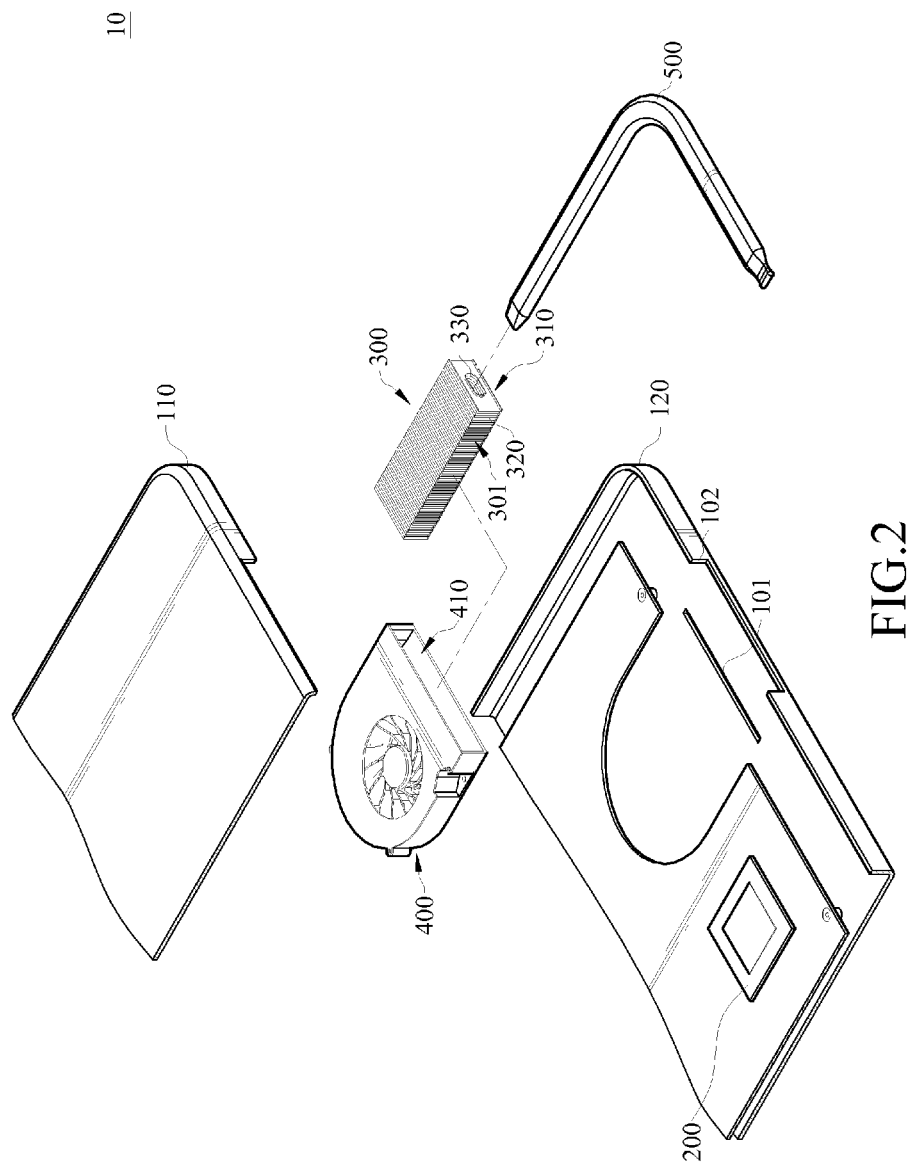

ELECTRONIC DEVICE

CROSS-REFERENCE TO RELATED APPLICATIONS

This non-provisional application claims priority under 35 U.S.C. §119(a) on Patent Application No(s). 201210369320.5 filed in China on Sep. 27, 2012, the entire contents of which are hereby incorporated by reference.

BACKGROUND OF THE INVENTION

1. Field of the Invention

The present disclosure relates to an electronic device, and more particularly to an electronic device having a radiator.

2. Description of the Related Art

In recent years, electronic devices usually are equipped with a heat dissipation piece or a set of heat dissipation fins within in thermal contact with a heat source. The heat dissipation piece or the heat dissipation fins are used for absorbing the heat of the heat source. Therefore, the effect of heat dissipation can be achieved by the heat dissipation piece or the heat dissipation fins with large heat dissipation areas.

In addition, electronic devices can be further equipped with at least one fan inside for generating an air stream that blows over the heat dissipation piece or the heat dissipation fins. Thus, the heat absorbed by the heat dissipation piece or the heat dissipation fins can be removed faster by the air stream generated by the fan.

As users demand higher performance, the computing capabilities of these electronic devices increases to the extent that more heat is generated. Only relying on the fan and the heat dissipation piece or the heat dissipation fins to dissipate heat for the heat source is insufficient to remove the heat out of the electronic devices. Therefore, heat continuously accumulated in the electronic devices will cause the temperature to increase, and may result in failure of the electronic devices because of over temperature conditions.

Therefore, what is needed is a technique to enhance the heat dissipation efficiency in electronic devices.

SUMMARY OF THE INVENTION

The electronic device disclosed in the present disclosure comprises a case, a heat source, a radiator, and an air stream generator. The case has an air ventilation hole and an opening. The heat source is disposed in the case. The radiator is disposed in the case and in thermal contact with the heat source. The radiator comprises a main body. The main body has a first side surface, a second side surface, and a third side surface. The first side surface and the second side surface are opposite to each other. The third side surface is disposed between the first side surface and the second side surface. A first air inlet is disposed on the first side surface, an air outlet is disposed on the second side surface, and a second air inlet is disposed on the third side surface. The third side surface and the case are separated from each other at a distance. The opening is exposed to the air outlet. The main body consists of a plurality of fins, and the fins are extended from the first air inlet toward the air outlet. The fins have a geometric middle plane. The geometric middle plane is disposed between the first side surface and the second side surface. The second air inlet is disposed between the geometric middle plane and the second side surface. The distance between the second air inlet and the first side surface is greater than another distance between the air ventilation hole and the first side surface. The air stream generator is disposed in the case. An air exhausting hole of the air stream generator is attached to the first air inlet.

The electronic device disclosed in the present disclosure comprises a case, a heat source, a radiator, and an air stream generator. The case has an air ventilation hole and an opening. The heat source is disposed in the case. The radiator is disposed in the case and in thermal contact with the heat source. The radiator comprises a main body. The main body has a first side surface, a second side surface, and a third side surface. The first side surface and the second side surface are opposite to each other. The third side surface is disposed between the first side surface and the second side surface. A first air inlet is disposed on the first side surface, an air outlet is disposed on the second side surface, and a second air inlet is disposed on the third side surface. The third side surface and the case are separated from each other at a distance. The opening is exposed to the air outlet. The main body consists of a plurality of fins, and the fins are extended from the first air inlet toward the air outlet. The fins have a geometric middle line. The geometric middle line is disposed between the first side surface and the second side surface. The second air inlet is disposed between the geometric middle line and the second side surface. The distance between the second air inlet and the first side surface is greater than the distance between the air ventilation hole and the first side surface. The air stream generator is disposed in the case. An air exhausting hole of the air stream generator is attached to the first air inlet. The air stream generator generates a first air stream flowing from the first air inlet of the main body toward the air outlet of the main body. By the difference between the pressure in the main body and the pressure outside the case, the first air stream draws a second air stream outside the case to make the second air stream flow between the main body and the case through the air ventilation hole, and then flow into the main body of the radiator from the second air inlet.

BRIEF DESCRIPTION OF THE DRAWINGS

The present disclosure will become more fully understood from the detailed description given herein below for illustration only, and thus does not limit the present disclosure, wherein:

FIG. 2 is an exploded perspective view of the electronic device of FIG. 1;

DETAILED DESCRIPTION

Figure 1:
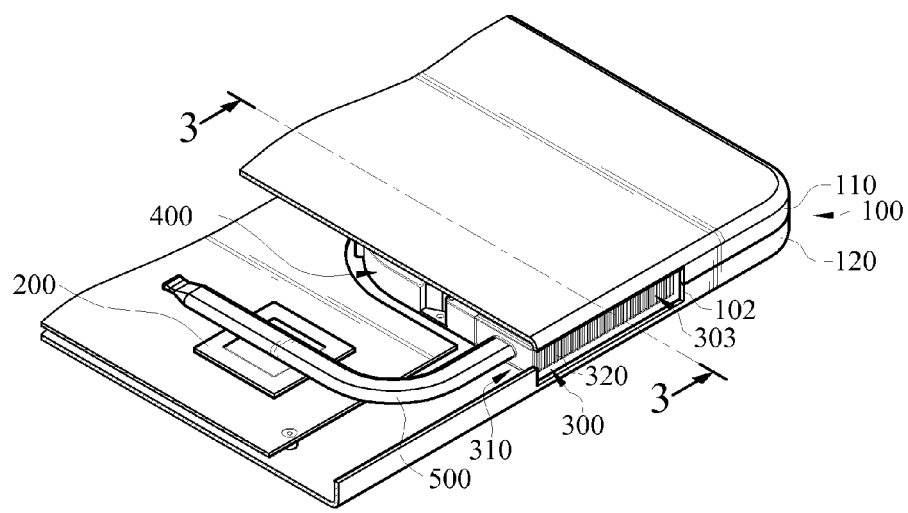
FIG. 1 is a structural perspective view of an electronic device according to an embodiment of the disclosure.
Figure 3A:
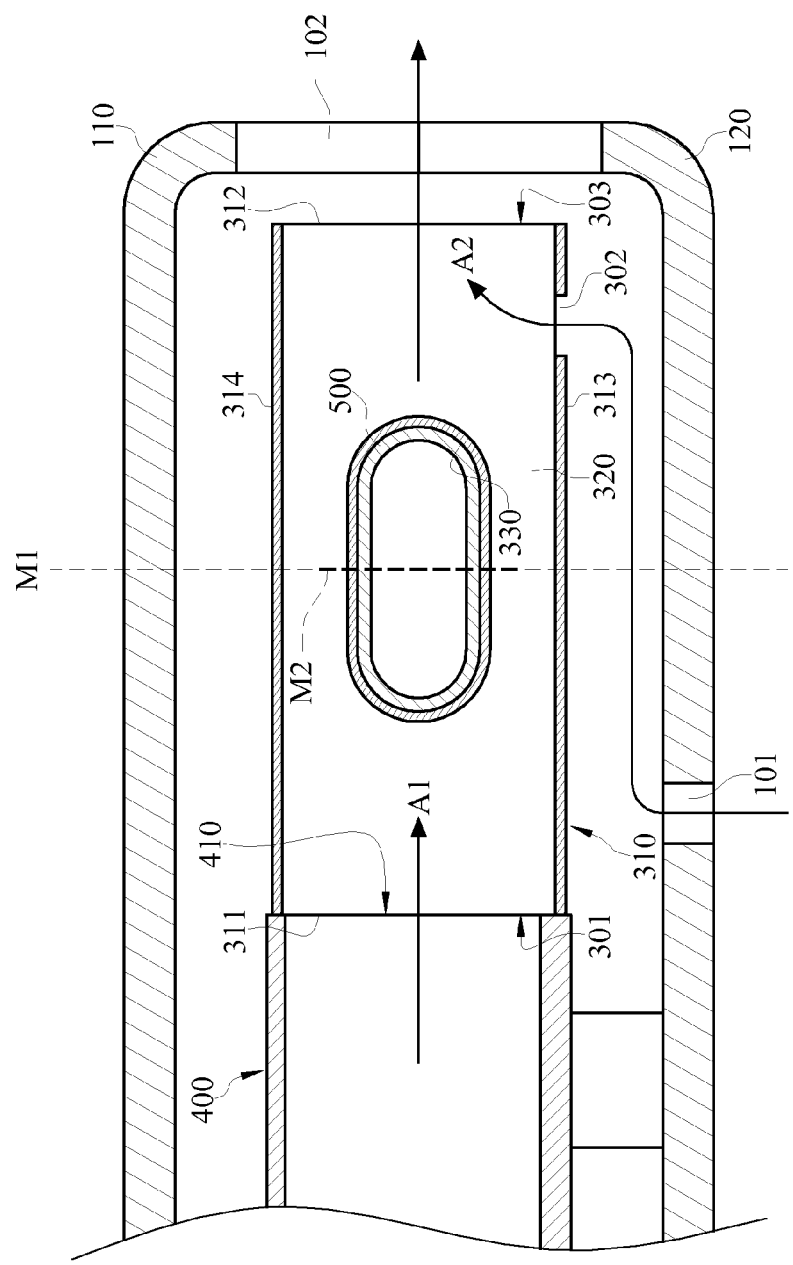
FIG. 3A is a cross-sectional view of the electronic device of FIG. 1 along a line 3-3.

Please refer to FIGS. 1 to 3A. FIG. 1 is a structural perspective view of an electronic device 10 according to an embodiment of the disclosure. FIG. 2 is an exploded perspective view of the electronic device of FIG. 1. FIG. 3A is a cross-sectional view of the electronic device of FIG. 1 along a line 3-3. A laptop is used for the electronic device 10 as an example, but does not limit the present disclosure.

The electronic device 10 of this embodiment comprises a case 100, a heat source 200, a radiator 300, and an air stream generator 400.

The case 100 has an air ventilation hole 101 and an opening 102. More specifically, the case 100 of this embodiment comprises an upper case 110 and a lower case 120. The air ventilation hole 101 may be disposed on the lower case 120, but does not limit the present disclosure. For example, in other embodiments, the air ventilation hole 101 may be disposed on the upper case 110. The opening 102 is disposed on a lateral side of the case 100 as formed by the upper case 110 and the lower case 120 together.

The heat source 200 is disposed in the case 100. The heat source 200 may be a central processing unit (CPU) or a graphics processing unit (GPU), but does not limit the present disclosure.

The radiator 300 is disposed in the case 100. More specifically, the radiator 300 is covered by the upper case 110 and the lower case 120 together. Furthermore, the radiator 300 is in thermal contact with the heat source 200. The electronic device 10 of this embodiment further comprises a heat conduction pipe 500. Two opposite ends of the heat conduction pipe 500 are in thermal contact with the heat source 200 and the radiator 300 respectively so that the radiator 300 is in thermal contact with the heat source 200 through the heat conduction pipe 500. Furthermore, in this embodiment, the radiator 300 has a slot 330. The end of the heat conduction pipe 500 which is farther away from the heat source 200 is disposed in the slot 330 such that the heat conduction pipe 500 is in thermal contact with the radiator 300.

The radiator 300 comprises a main body 310. The main body 310 has a first side surface 311, a second side surface 312, a third side surface 313, and a fourth side surface 314. The first side surface 311 and the second side surface 312 are oppositely disposed. The third side surface 313 and the fourth side surface 314 are both disposed between the first side surface 311 and the second side surface 312. The first side surface 311 faces toward the inside of the electronic device 10. The second side surface 312 faces toward the opening 102 of the case 100. The third side surface 313 faces toward the lower case 120. The fourth side surface 314 faces toward the upper case 110. It should be noted that, in other embodiments, when the air ventilation hole 101 is disposed on the upper case 110, the third side surface 313 may face toward the upper case 110, and the fourth side surface 314 can face toward the lower case 120. Furthermore, a laptop is used for the electronic device 10 of this embodiment as an example; the upper case 110 and the lower case 120 are the upper case with the keyboard and the lower case of the laptop respectively, but does not limit the present disclosure. In other embodiments, the electronic device 10 of this embodiment may be a tablet computer; the upper case 110 and the lower case 120 are the monitor case and the bottom case of the tablet computer respectively. In addition, in other embodiments, the electronic device 10 of this embodiment may be a mobile phone; the upper case 110 and the lower case 120 are the monitor case and the bottom case of the mobile phone respectively.

In this embodiment, the third side surface 313 is separated by a distance from the lower case 120 of the case 100 and is not in contact with the lower case 120 of the case 100. But this configuration does not limit the present disclosure. For example, in other embodiments, when the air ventilation hole 101 is disposed on the upper case 110 and the third side surface 313 faces toward the upper case 110, the third side surface 313 may be separated by a distance from the upper case 110 of the case 100 and not be in contact with each other. A first air inlet 301 is disposed on the first side surface 311, an air outlet 303 is disposed on the second side surface 312, and a second air inlet 302 is disposed on the third side surface 313. The opening 102 is exposed to the air outlet 303.

More specifically, the main body 310 consists of a plurality of fins 320, and the fins 320 are extended from the first air inlet 301 toward the air outlet 303. The fins 320 have a geometric middle plane M1 as shown in FIG. 3A. The geometric middle plane M1 is disposed between the first side surface 311 and the second side surface 312. The geometric middle plane M1 is the longitudinal middle side (vertical direction) of the fins 320. In other words, the geometric middle plane M1 is disposed at the center between the left edge and the right edge of the fins 320. Therefore, the distance between the geometric middle plane M1 and the left edge (adjacent the first side surface 311) of the fins 320 is equal to the distance between the geometric middle plane M1 and the right edge (adjacent the second side surface 312) of the fins 320. The second air inlet 302 is disposed between the geometric middle plane M1 and the second side surface 312. In other words, the second air inlet 302 is adjacent to the second side surface 312 of the main body 310. Therefore, the distance between the second air inlet 302 and the first side surface 311 is greater than the distance between the second air inlet 302 and the second side surface 312.

Furthermore, the distance between the second air inlet 302 and the first side surface 311 is greater than the distance between the air ventilation hole 101 and the first side surface 311. In other words, as shown in FIG. 3A, the second air inlet 302 is disposed on the right side of the air ventilation hole 101.

Furthermore, in this embodiment, the heat conduction pipe 500 has a cross-sectional middle line M2 as shown in FIG. 3A. The cross-sectional middle line M2 is the longitudinal middle line of the cross-sectional area of the heat conduction pipe 500 formed by sectioning along the radial direction. The distance between the cross-sectional middle line M2 and the left edge of the sectional area of the heat conduction pipe 500 is equal to the distance between the cross-sectional middle line M2 and the right edge of the sectional area of the heat conduction pipe 500. The cross-sectional middle line M2 is overlapped with the geometric middle plane M1 of the fins 320. In other words, the heat conduction pipe 500 is disposed at the geometrical center of the fins 320. Thus, the heat of the heat conduction pipe 500 may be transferred and distributed to the fins 320 more evenly.

Figure 3B:
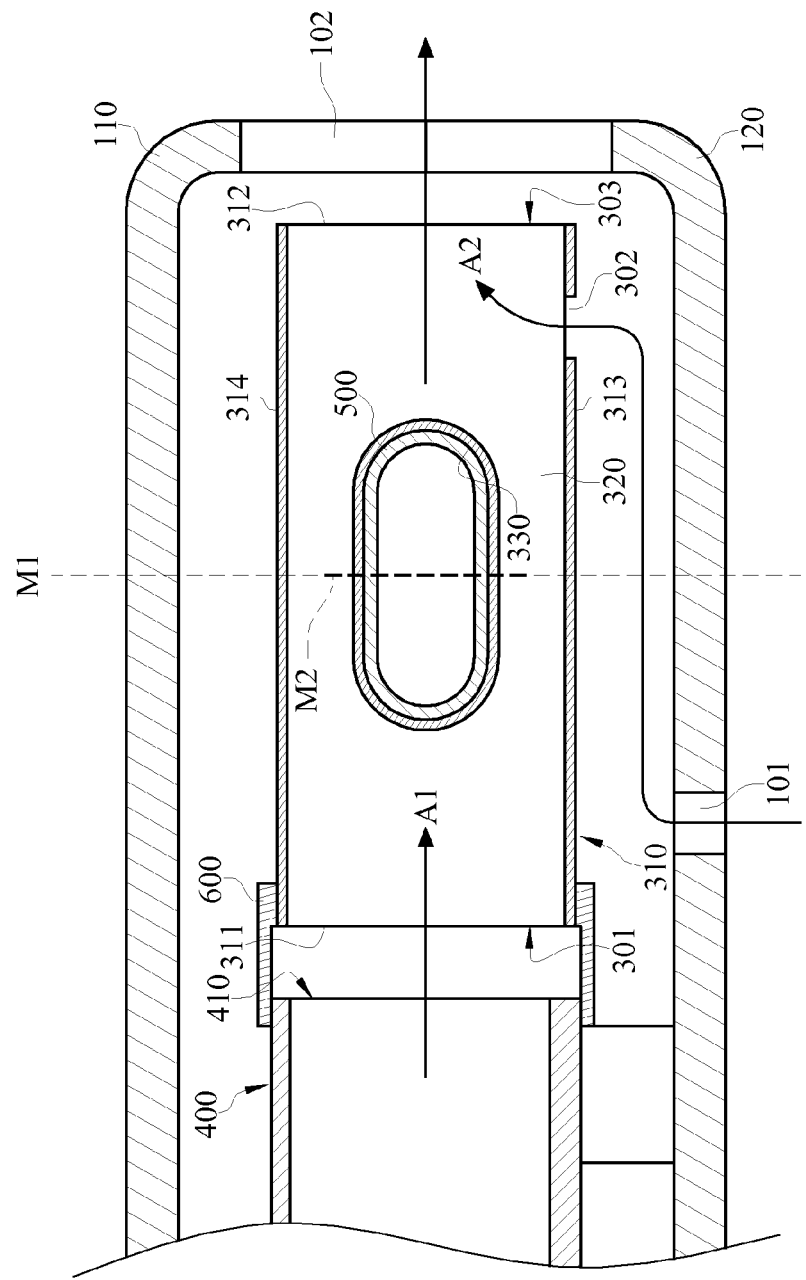
FIG. 3B is a cross-sectional view of the electronic device according to another embodiment of the disclosure.

The air stream generator 400 is disposed in the case 100. In this embodiment, a centrifugal fan is used for the air stream generator 400 as an example, but does not limit the present disclosure. For example, in other embodiments, the air stream generator 400 may also be an axial fan or a turbulent, pulsated air jet module such as a SYNJET®. An air exhausting hole 410 of the air stream generator 400 is attached to the first air inlet 301. There is no side gap between the air exhausting hole 410 and the first air inlet 301 in order to prevent from drawing in an unexpected air stream to reduce the heat dissipation efficiency. More specifically, by attaching the air exhausting hole 410 of the air stream generator 400 on the first side surface 311 of the main body 310 directly, there will be no side gap between the air exhausting hole 410 and the first air inlet 301. Or, in other embodiments, the radiator 300 further comprises a covering element 600 as shown in FIG. 3B. By sleeving the two opposite ends of the covering element 600 respectively at the end of the main body 310 adjacent to the first side surface 311 and the end of the air stream generator 400 adjacent to the air exhausting hole 410, the side gap between the air exhausting hole 410 and the first air inlet 301 is sealed off.

When the air stream generator 400 operates to generate a first air stream A1, the first air stream A1 enters into the main body 310 of the radiator 300 from the first air inlet 301. After the first air stream A1 performs heat transfer with the fins 320 in the main body 310, the first air stream A1 is exhausted from the air outlet 303. The first air stream A1 generated by the air stream generator 400 is usually blown in the radiator 300, and the heat between the radiator 300 and the case 100 is difficult to be dissipated. Therefore in this embodiment, the second air inlet 302 is disposed on the third side surface 313 of the main body 310 of the radiator 300, and the air ventilation hole 101 is disposed on the lower case 120 in order to enhance the heat dissipation effect.

More specifically, the Bernoulli Principle states that an increase in the speed of a fluid occurs simultaneously with a decrease in pressure. Therefore, when the first air stream A1 generated by the air stream generator 400 flows from the first air inlet 301 to the air outlet 303, the pressure in the main body 310 of the radiator 300 is less than the pressure outside the main body 310. As a result, the air between the main body 310 and the case 100 may be drawn into the radiator 300; and the cold air outside the case 100 may also be drawn to flow between the main body 310 of the radiator 300 and the case 100 to generate a second air stream A2. The second air stream A2 flows between the main body 310 and the case 100 through the air ventilation hole 101, and then flows in the main body 310 of the radiator 300 through the second air inlet 302. Therefore, in addition to the first air stream A1 generated by the air stream generator 400, the second air stream A2 formed by the cold air outside the case 100 may also perform heat transfer with the radiator 300 and the case 100 when passing between the main body 310 and the case 100. The second air stream A2 is also drawn into the main body 310 of the radiator 300 to perform heat transfer with the fins 320.

Furthermore, because the distance between the second air inlet 302 and the first side surface 311 is greater than the distance between the air ventilation hole 101 and the first side surface 311, the second air stream A2 formed by the cold air has a longer flowing path between the main body 310 of the radiator 300 and the case 100. Thus, the second air stream A2 formed by the cold air may dissipate heat between the main body 310 and the case 100. As a result, the heat dissipation efficiency of the electronic device 10 is enhanced.

Figure 4:
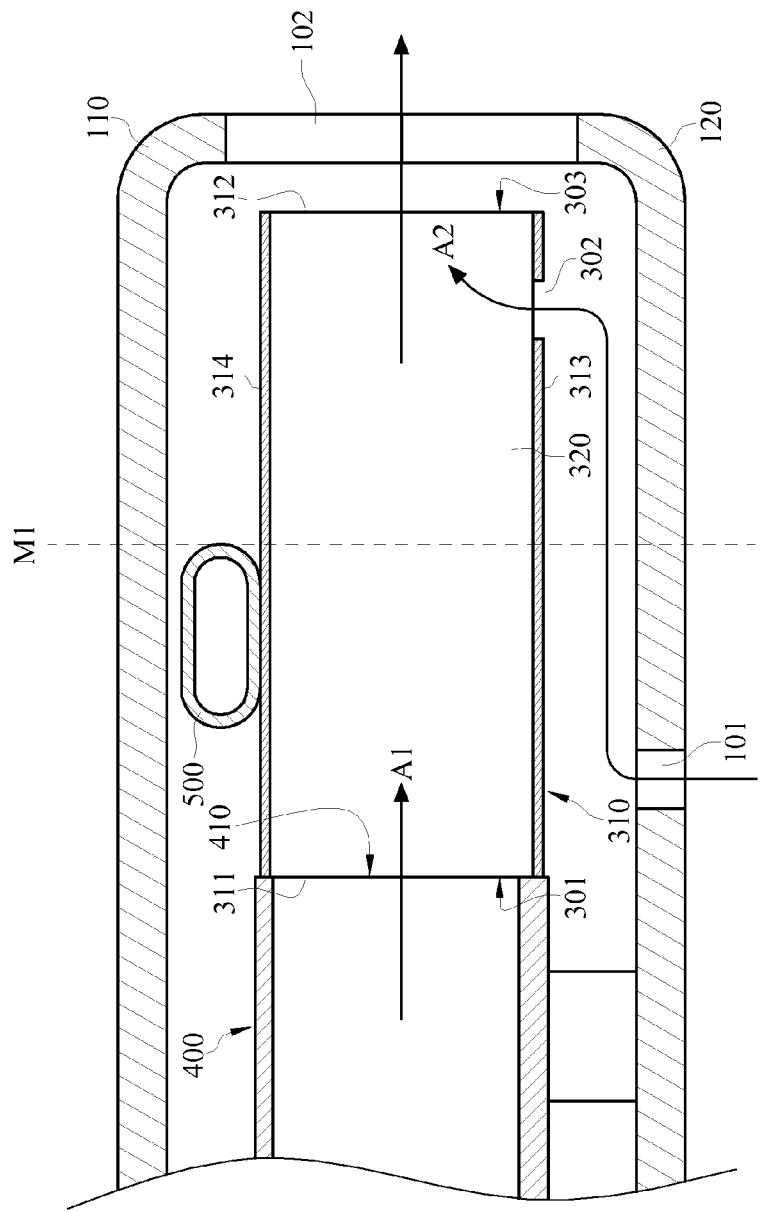
FIG. 4 is a cross-sectional view of the electronic device according to another embodiment of the disclosure.

Please refer to FIG. 4. FIG. 4 is a cross-sectional view of the electronic device according to another embodiment of the disclosure. This embodiment is similar to the embodiment of FIG. 3A. Similar elements are represented by the same numerals.

The difference between this embodiment and the embodiment of FIG. 3A is that the heat conduction pipe 500 of this embodiment is directly attached to the surface of the main body 310 of the radiator 300 to be in thermal contact with the main body 310. More specifically, the heat conduction pipe 500 is directly attached to the fourth side surface 314 of the main body 310, but does not limit the present disclosure. For example, in other embodiments, the heat conduction pipe 500 may be directly attached to the third side surface 313 of the main body 310.

Figure 5A:
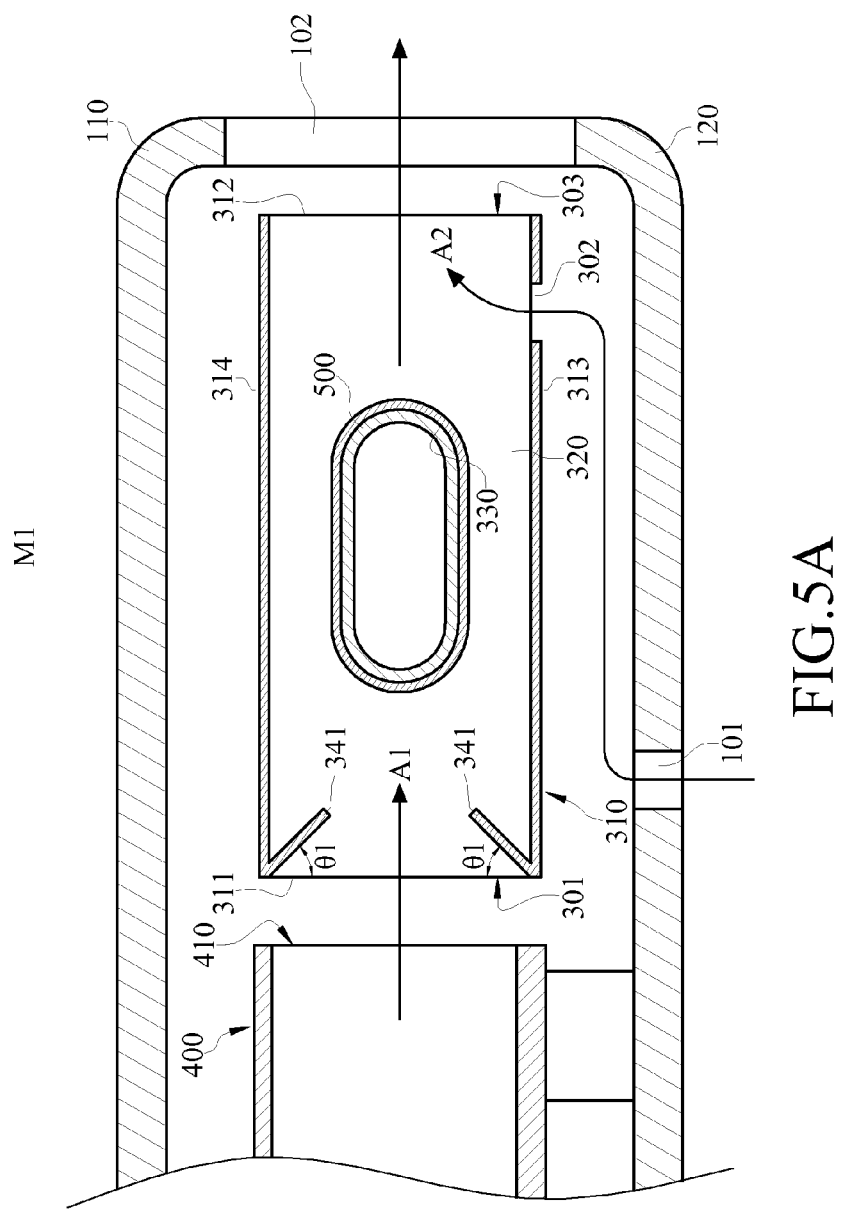
FIG. 5A is a cross-sectional view of the electronic device according to another embodiment of the disclosure.

Please refer to FIG. 5A. FIG. 5A is a cross-sectional view of the electronic device according to another embodiment of the disclosure. This embodiment is similar to the embodiment of FIG. 3A. Similar elements are represented by the same numerals.

The difference between this embodiment and the embodiment of FIG. 3A is that two first deflectors 341 are disposed in the main body 310 of the radiator 300 of this embodiment. An acute angle θ1 is formed between each of the first deflectors 341 and the first side surface 311. Each of the first deflectors 341 is adjacent to the first air inlet 301. Furthermore, the distance between the two first deflectors 341 gradually becomes shorter towards the direction farther away from the first air inlet 301. In other words, when the two first deflectors 341 extend toward the second side surface 312, the two first deflectors 341 grow closer to each other. When the first air stream A1 flows between the two first deflectors 341, because the cross-sectional area of the first air stream A1 is compressed by the two first deflectors 341 and becomes smaller, the velocity of the first air stream A1 increases accordingly. Therefore, the pressure difference between the area of the main body 310 of the radiator 300 and the area between the main body 310 and the case 100 is increased, and therefore the volume of air between the main body 310 and the case 100, drawn into the main body 310, is increased. As a result, the amount of the second air stream A2 formed by the outside cold air to flow between the main body 310 and the case 100 is increased. As a result, the heat dissipation efficiency is enhanced.

It should be noted that the number of the first deflectors 341 in this embodiment is two, but does not limit the present disclosure. For example, in other embodiments, the number of the first deflectors 341 may be one.

Figure 5B:
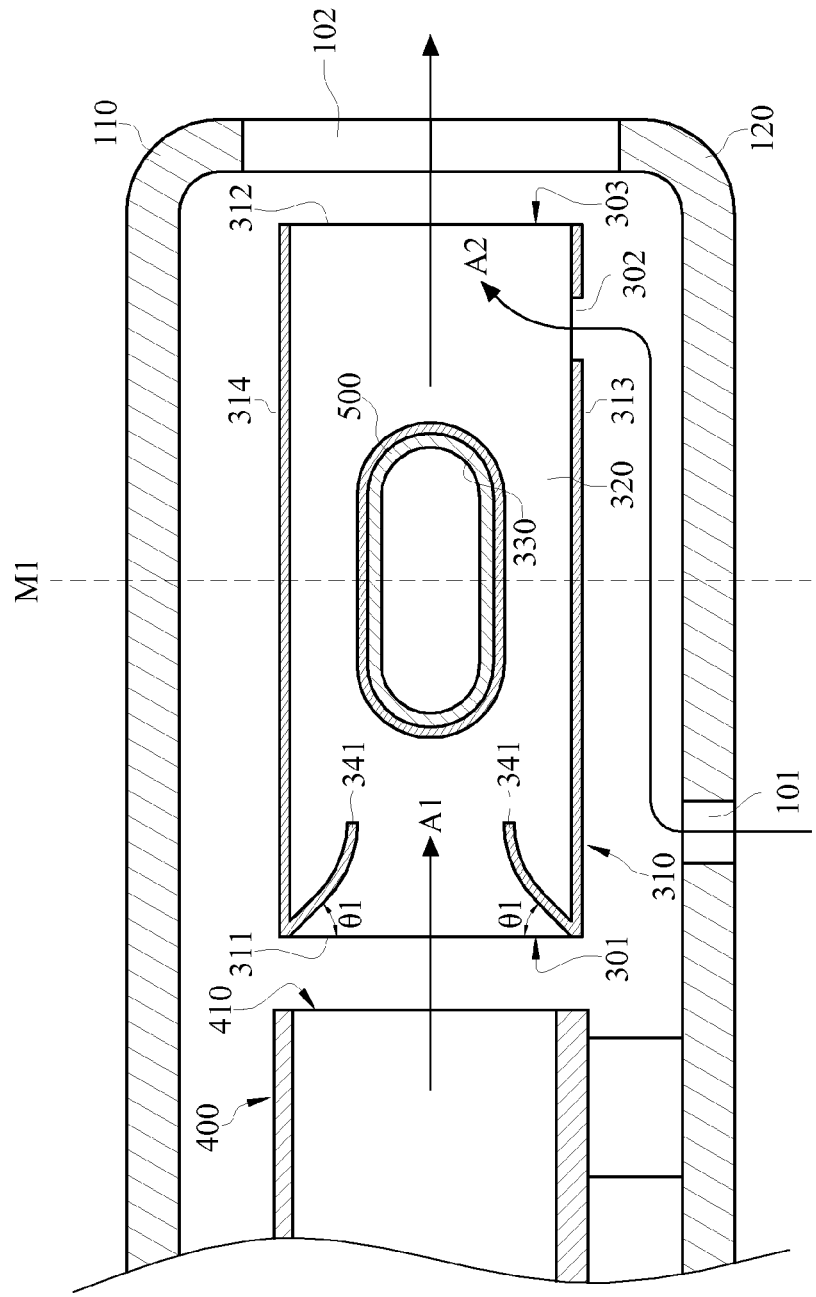
FIG. 5B is a cross-sectional view of the electronic device according to another embodiment of the disclosure.
Figure 5C:
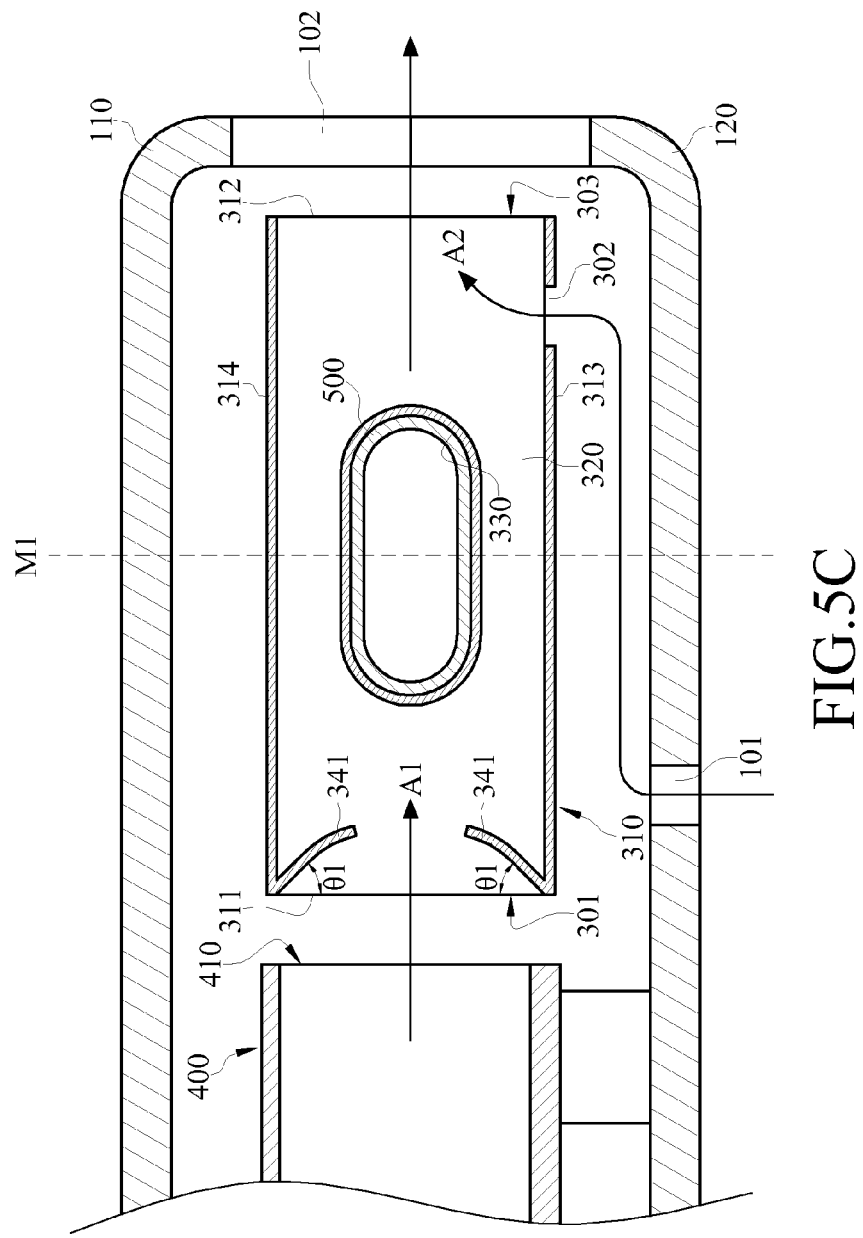
FIG. 5C is a cross-sectional view of the electronic device according to another embodiment of the disclosure.

Furthermore, in this embodiment, the first deflectors 341 are flat plates. But the shape of the first deflectors 341 does not limit the present disclosure. For example, in other embodiments, the shape of the first deflectors 341 may be a convex plate as shown in FIG. 5B, which is a cross-sectional view of the electronic device according to another embodiment of the disclosure. Alternatively, the shape of the first deflectors 341 may be a concave plate as shown in FIG. 5C, which is a cross-sectional view of the electronic device according to another embodiment of the disclosure.

Figure 6A:
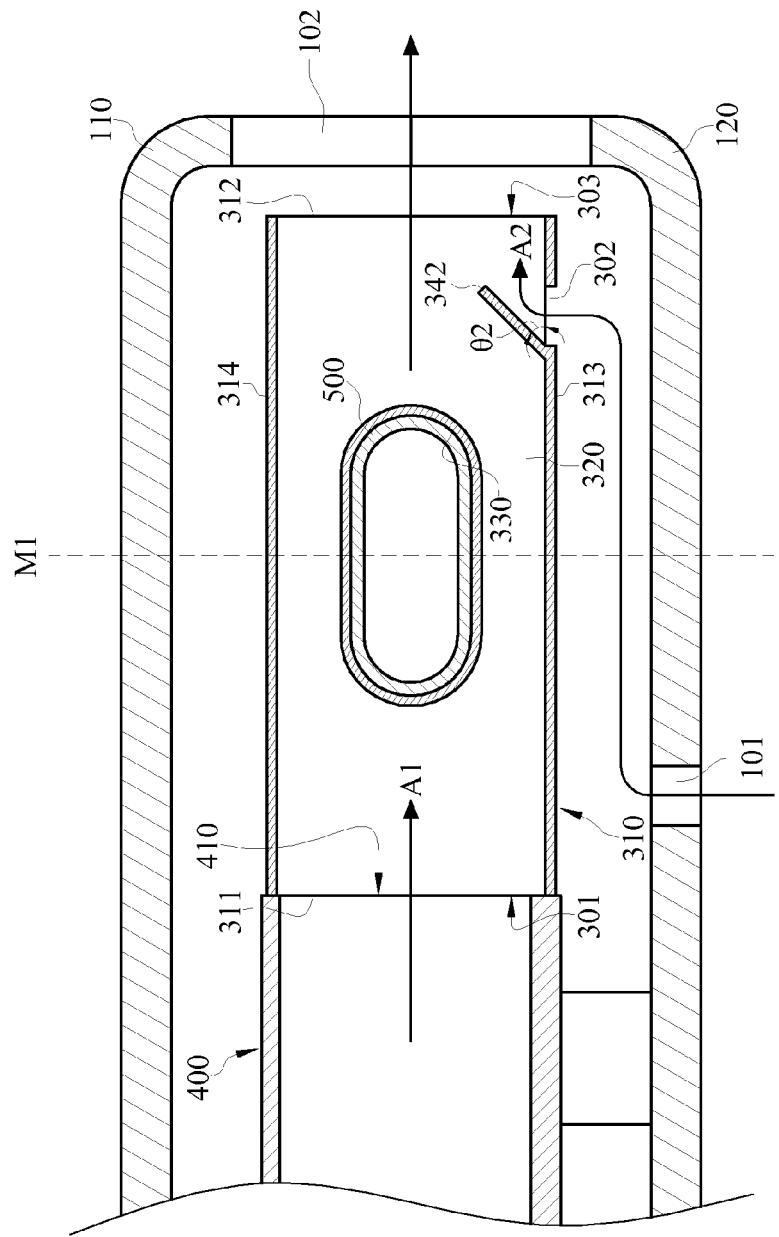
FIG. 6A is a cross-sectional view of the electronic device according to another embodiment of the disclosure.

Please refer to FIG. 6A, which is a cross-sectional view of the electronic device according to another embodiment of the disclosure. This embodiment is similar to the embodiment of FIG. 3A. Similar elements are represented by the same numerals.

The difference between this embodiment and the embodiment of FIG. 3A is that a second deflector 342 is disposed in the main body 310 of the radiator 300. An acute angle θ2 is formed between the second deflector 342 and the third side surface 313. The second deflector 342 is adjacent to the second air inlet 302, and an end of the second deflector 342 which is adjacent to the air outlet 303 is further away from the third side surface 313. The second deflector 342 is used to guide the second air stream A2 such that it flows smoothly toward the air outlet 303 in order to prevent turbulence between the second air stream A2 and the first air stream A1.

Figure 6B:
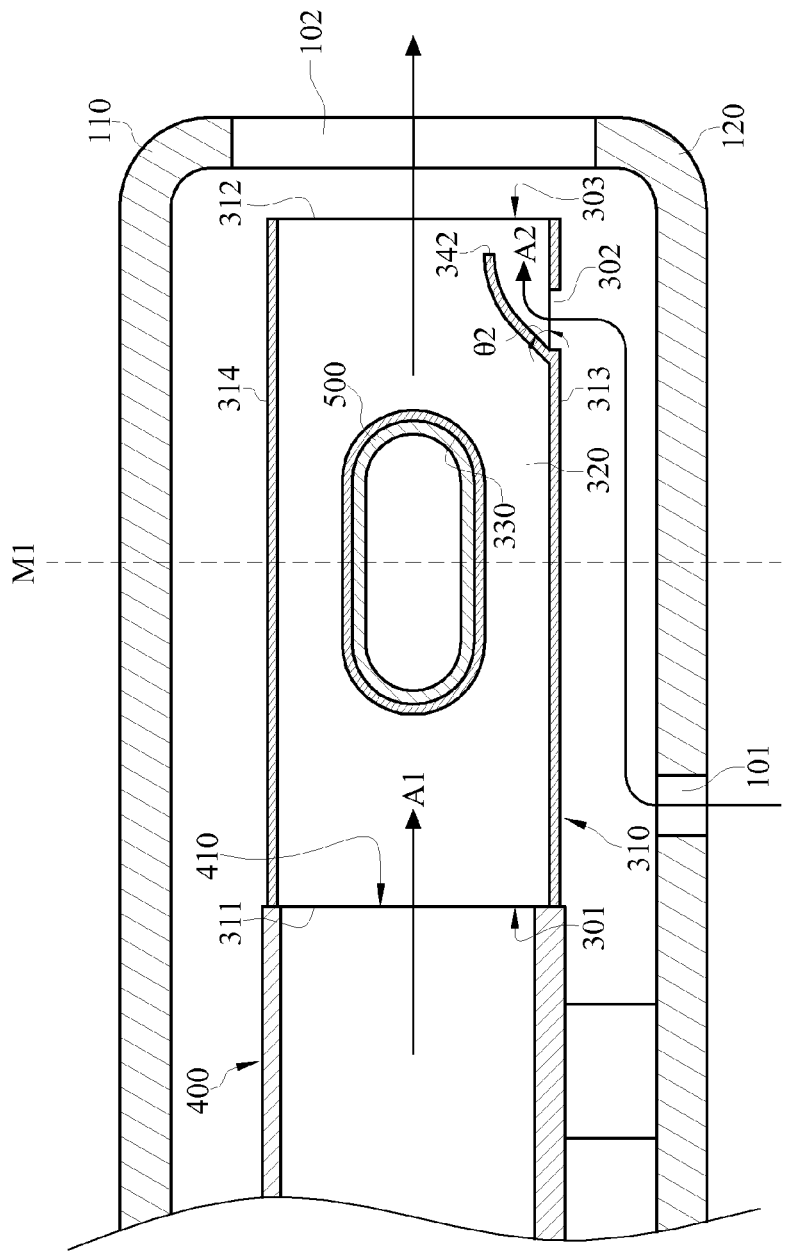
FIG. 6B is a cross-sectional view of the electronic device according to another embodiment of the disclosure.
Figure 6C:
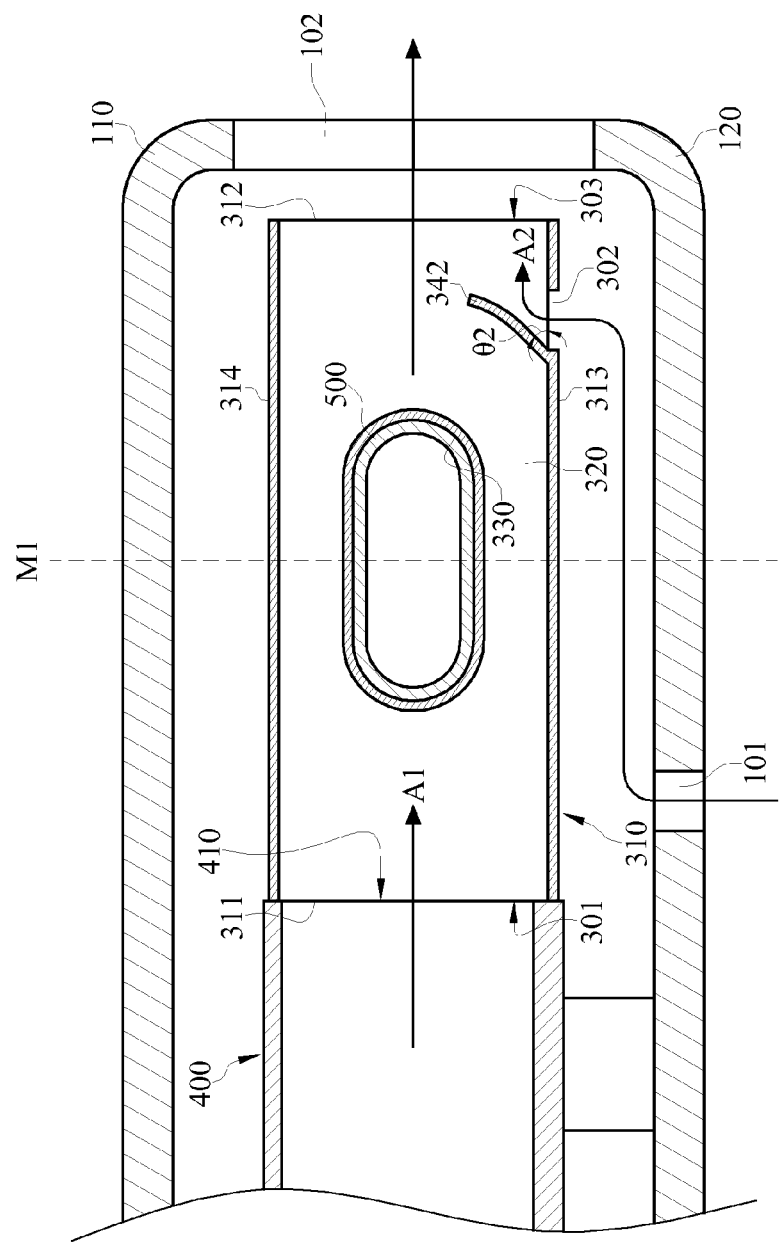
FIG. 6C is a cross-sectional view of the electronic device according to another embodiment of the disclosure.

Furthermore, in this embodiment, the second deflector 342 is a flat plate, but the shape of the second deflector 342 does not limit the present disclosure. For example, in other embodiments, the shape of the second deflector 342 may be a convex plate as shown in FIG. 6B, which is a cross-sectional view of the electronic device according to another embodiment of the disclosure. Alternatively, the shape of the second deflector 342 can be a concave plate as shown in FIG. 6C, which is a cross-sectional view of the electronic device according to another embodiment of the disclosure.

Figure 7:
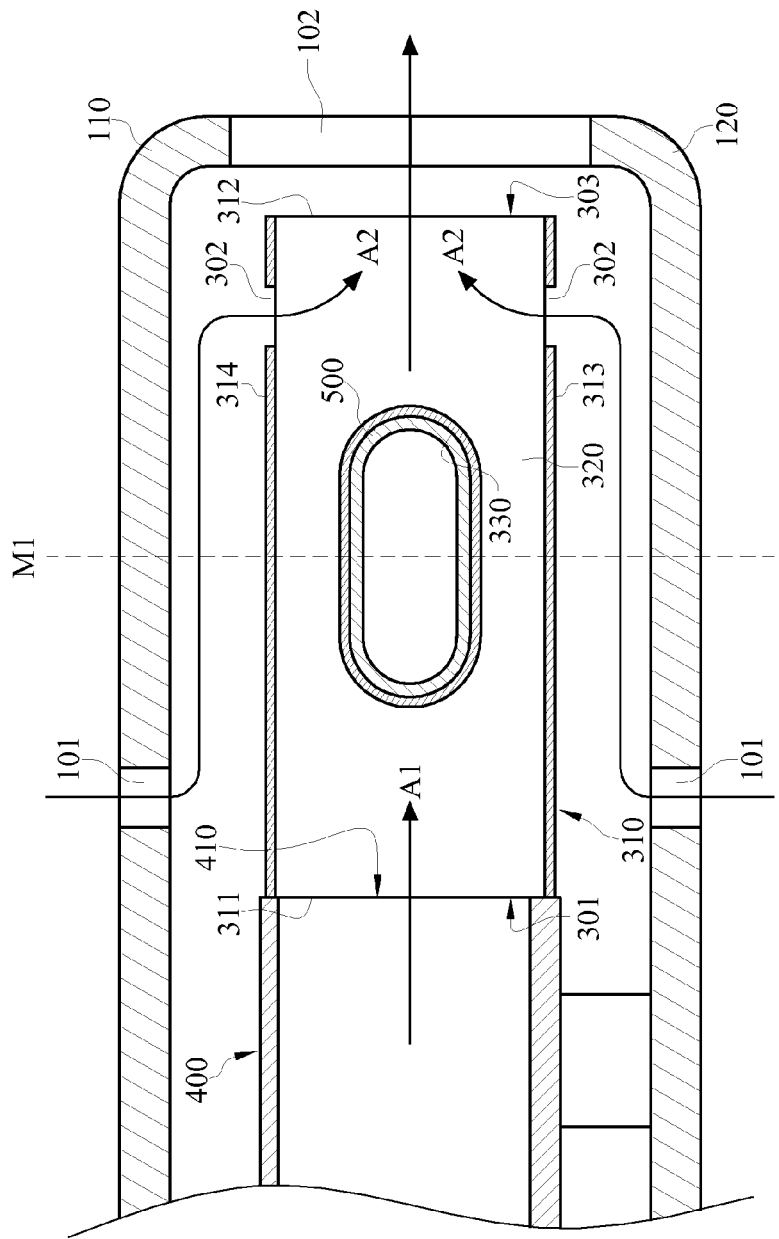
FIG. 7 is a cross-sectional view of the electronic device according to another embodiment of the disclosure.

Please refer to FIG. 7, which is a cross-sectional view of the electronic device according to another embodiment of the disclosure. This embodiment is similar to the embodiment of FIG. 3A. Similar elements are represented by the same numerals.

The difference between this embodiment and the embodiment of FIG. 3A is that the case 100 of this embodiment has two of the air ventilation holes 101 disposed on the upper case 110 and the lower case 120, respectively. The fourth side surface 314 is separated by a distance from the upper case 110 of the case 100 and is not in direct contact. Each of the third side surface 313 and the fourth side surface 314 of the radiator 300 includes the second air inlet 302.

In this embodiment, when the air stream generator 400 operates to generate the first air stream A1, the first air stream A1 enters into the main body 310 of the radiator 300 from the first air inlet 301. Thus, the air between the third side surface 313 of the main body 310 and the lower case 120 may be drawn in the radiator 300 as well as the air between the fourth side surface 314 and the upper case 110 may also be drawn in the radiator 300 such that the cold air outside the upper case 110 and the lower case 120 may be drawn to flow between the main body 310 of the radiator 300 and the case 100, and two streams of the second air stream A2 may be generated. Thus, more cold air is available for forming the two streams of the second air streams A2 in order to dissipate the heat between the main body 310 and the case 100. As a result, the heat dissipation efficiency of the electronic device 10 is enhanced.

According to the electronic device of the above embodiments, the second air inlet is disposed on the third side surface between the first air inlet and the air outlet, and the distance between the second air inlet and the first side surface is longer than that between the air ventilation hole of the case and the first side surface. Therefore, when the first air stream generated by the air stream generator flows from the first air inlet toward the air outlet, the air between the case and the main body can be drawn in the radiator, and the cold air outside the case can also be drawn to flow between the case and the main body in order to dissipate the heat of the electronic device and to enhance the heat dissipation efficiency.

The foregoing description of the exemplary embodiments of the invention has been presented only for the purposes of illustration and the description herein is not intended to be exhaustive or to limit the invention to the precise forms disclosed. Many modifications and variations are possible in light of the above teaching.

The embodiments were chosen and described in order to explain the principles of the invention and their practical application so as to motivate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electronic device, comprising:
a case having an air ventilation hole and an opening;
a heat source disposed in the case;
a radiator disposed in the case and in thermal contact with the heat source, the radiator comprising a main body wherein the main body has a first side surface, a second side surface, and a third side surface, the first side surface and the second side surface are opposite to each other, the third side surface is disposed between the first side surface and the second side surface, a first air inlet is disposed on the first side surface, an air outlet is disposed on the second side surface, a second air inlet is disposed on the third side surface, the third side surface and the case are separated from each other by a distance, the opening is exposed to the air outlet, the main body consists of a plurality of fins, and the plurality of fins is extended from the first air inlet toward the air outlet, the plurality of fins has a geometric middle plane disposed between the first side surface and the second side surface, the second air inlet is disposed between the geometric middle plane and the second side surface, and the distance between the second air inlet and the first side surface is greater than the distance between the air ventilation hole and the first side surface; and
an air stream generator disposed in the case, the air stream generator including an air exhausting hole attached to the first air inlet.

2. The electronic device as claimed in claim 1, further comprising a heat conduction pipe, wherein two opposite ends of the heat conduction pipe are in thermal contact with the heat source and the radiator, respectively.

3. The electronic device as claimed in claim 2, wherein the heat conduction pipe is attached to a surface or the third side surface of the main body of the radiator.

4. The electronic device as claimed in claim 2, wherein the radiator has a slot, the heat conduction pipe passes through and is disposed in the slot.

5. The electronic device as claimed in claim 2, wherein a cross-sectional middle line of the heat conduction pipe is overlapped with the geometric middle plane of the fins.

6. The electronic device as claimed in claim 1, wherein a first deflector is further disposed in the main body, an acute angle is formed between the first deflector and the first side surface, the first deflector is adjacent to the first air inlet.

7. The electronic device as claimed in claim 6, wherein the shape of the first deflector is a flat plate, a convex plate, or a concave plate.

8. The electronic device as claimed in claim 1, wherein a second deflector is further disposed in the main body, an acute angle is formed between the second deflector and the third side surface, the second deflector is adjacent to the second air inlet, and an end of the second deflector adjacent the air outlet is extended outwardly away from the third side surface.

9. The electronic device as claimed in claim 8, wherein the shape of the second deflector is a flat plate, a convex plate, or a concave plate.

10. The electronic device as claimed in claim 1, wherein the opening is formed by an upper case and a lower case.

11. The electronic device as claimed in claim 1, wherein the radiator further comprises a covering element, two opposite ends of the covering element are respectively sleeved at an end of the main body adjacent to the first side surface and an end of the air stream generator adjacent to the air exhausting hole.

12. An electronic device, comprising:
a case having an air ventilation hole and an opening;
a heat source disposed in the case;
a radiator disposed in the case and in thermal contact with the heat source, the radiator comprising a main body, wherein the main body has a first side surface, a second side surface, and a third side surface, the first side surface and the second side surface are opposite to each other, the third side surface is disposed between the first side surface and the second side surface, a first air inlet is disposed on the first side surface, an air outlet is disposed on the second side surface, a second air inlet is disposed on the third side surface, the third side surface and the case are separated from each other by a distance, the opening is exposed to the air outlet, the main body consists of a plurality of fins, and the plurality of fins is extended from the first air inlet toward the air outlet, the plurality of fins has a geometric middle plane disposed between the first side surface and the second side surface, the second air inlet is disposed between the geometric middle plane and the second side surface, and the distance between the second air inlet and the first side surface is greater than the distance between the air ventilation hole and the first side surface; and an air stream generator disposed in the case, the air stream generator including an air exhausting hole attached to the first air inlet wherein the air stream generator generates a first air stream flowing from the first air inlet of the main body toward the air outlet of the main body, by the difference between the pressure in the main body and the pressure outside the case, the first air stream draws a second air stream outside the case to make the second air stream flow between the main body and the case through the air ventilation hole, and then flow into the main body of the radiator from the second air inlet.

13. The electronic device as claimed in claim 12, further comprising a heat conduction pipe, wherein two opposite ends of the heat conduction pipe are in thermal contact with the heat source and the radiator, respectively.

14. The electronic device as claimed in claim 13, wherein the heat conduction pipe is attached to a surface or the third side surface of the main body of the radiator.

15. The electronic device as claimed in claim 13, wherein the radiator has a slot, and the heat conduction pipe is disposed in the slot.

16. The electronic device as claimed in claim 13, wherein a cross-sectional middle line of the heat conduction pipe is overlapped with the geometric middle plane of the plurality of fins.

17. The electronic device as claimed in claim 12, wherein a first deflector is further disposed in the main body, an acute angle is formed between the first deflector and the first side surface, and the first deflector is adjacent to the first air inlet.

18. The electronic device as claimed in claim 12, wherein the shape of the first deflector is a flat plate, a convex plate, or a concave plate.

19. The electronic device as claimed in claim 12, wherein a second deflector is further disposed in the main body, an acute angle is formed between the second deflector and the third side surface, the second deflector is adjacent to the second air inlet, and an end of the second deflector adjacent the air outlet is extended outwardly away from the third side surface.

20. The electronic device as claimed in claim 12, wherein the shape of the second deflector is a flat plate, a convex plate, or a concave plate.

21. The electronic device as claimed in claim 12, wherein the opening is formed by an upper case and a lower case.

22. The electronic device as claimed in claim 12, wherein the radiator further comprises a covering element, two opposite ends of the covering element are respectively sleeved at an end of the main body adjacent to the first side surface and an end of the air stream generator adjacent to the air exhausting hole.

* * * * *